(12) United States Patent
Reime (10) Patent No.: US 9,035,662 B2
(45) Date of Patent: May 19, 2015

(54) METHOD AND DEVICE FOR ACCURATE CAPACITIVE MEASURED VALUE ACQUISITION

(76) Inventor: Gerd Reime, Buhl (DE)

( * ) Notice: Subject to any disclaimer, the term of this patent is extended or adjusted under 35 U.S.C. 154(b) by 381 days.

(21) Appl. No.: 12/911,806

(22) Filed: Oct. 26, 2010

(65) Prior Publication Data

US 2011/0095771 A1 Apr. 28, 2011

(30) Foreign Application Priority Data

Oct. 27, 2009 (DE) .......................... 10 2009 050 894
Dec. 9, 2009 (DE) .......................... 10 2009 057 439

(51) Int. Cl.
| | |
|---|---|
| *G01R 27/26* | (2006.01) |
| *G01L 3/00* | (2006.01) |
| *G01L 1/04* | (2006.01) |
| *G01V 3/08* | (2006.01) |
| *G01D 5/24* | (2006.01) |

(52) U.S. Cl.
CPC ............ *G01V 3/088* (2013.01); *G01R 27/2605* (2013.01); *G01D 5/24* (2013.01)

(58) Field of Classification Search
CPC ............................. G01R 27/2605; G01D 5/24
USPC .......................... 342/658, 661, 686, 687, 688; 73/862.337, 862.626
See application file for complete search history.

(56) References Cited

U.S. PATENT DOCUMENTS

| | | | | |
|---|---|---|---|---|
| 4,099,118 | A | * 7/1978 | Franklin et al. | ................ 324/671 |
| 5,023,559 | A | * 6/1991 | Andermo | ...................... 324/662 |
| 5,172,065 | A | * 12/1992 | Wallrafen | ..................... 324/683 |

(Continued)

FOREIGN PATENT DOCUMENTS

| | | |
|---|---|---|
| DE | 3942159 A1 | 6/1991 |
| DE | 19843749 A1 | 2/2000 |

(Continued)

OTHER PUBLICATIONS

Larry K. Baxter "Capacitive Sensors", IEEE Industrial Electronics Society, pp. 45, 55-56 and 237, Dec. 22, 2012, 01-00003-00000045-49.

"Optical Sensors & Halios", ELMOS Semiconductor AG [Infosheet], Dec. 19, 2012, 1 pg, E909.03, http://www.elmos.com/produkte/automotive/optical-sensors/haliosr-ics/ . . .

*Primary Examiner* — Patrick Assouad
*Assistant Examiner* — Hoang X Nguyen
(74) *Attorney, Agent, or Firm* — Cantor Colburn LLP (57) ABSTRACT

A device and a method for the capacitive detection of an object which is preferably arranged behind a flat article that is transparent to electromagnetic radiation or a wall, including a sensor incorporating sensor electrodes for the detection of the object, preferably for the detection of relative movements between the sensor and the flat article or a finger, where a control circuit serves for the control of the sensor electrodes and for the evaluation of the output signals of the sensor, and, due to the fact that the sensor comprises at least one sensor electrode which is surrounded by at least one further electrode, the surrounding further electrode is connected to the sensor electrode by the control circuit in such a manner that, in the event of a change of the potential of the sensor electrode, the potential of the surrounding further electrode is regulated in the opposite sense to the sensor electrode in such a way that the sensor electrode remains at a pre-determined or pre-definable potential, such that there is produced a capacitive sensor which does not react to tilting or small changes in the spacing from the surface.

15 Claims, 8 Drawing Sheets

(56) References Cited

U.S. PATENT DOCUMENTS

| | | | |
|---|---|---|---|
| 5,585,733 | A | 12/1996 | Paglione |
| 6,023,159 | A | 2/2000 | Heger |
| 6,198,271 | B1 | 3/2001 | Heger et al. |
| 7,148,704 | B2 | 12/2006 | Philipp |
| 2004/0000918 | A1 | 1/2004 | Sanoner et al. |
| 2005/0194959 | A1* | 9/2005 | Miller .............................. 324/67 |
| 2008/0036644 | A1* | 2/2008 | Skultety-Betz et al. ........ 342/22 |
| 2009/0045822 | A1* | 2/2009 | Nosovitsky et al. ........... 324/686 |
| 2009/0230945 | A1* | 9/2009 | Smoot ............................. 324/67 |
| 2011/0133756 | A1* | 6/2011 | Reime ........................... 324/658 |

FOREIGN PATENT DOCUMENTS

| | | |
|---|---|---|
| DE | 10131243 C1 | 11/2002 |
| DE | 10324579 A1 | 12/2004 |
| DE | 102005031607 A1 | 2/2006 |
| DE | 102007048402 A1 | 4/2009 |
| EP | 0657032 B1 | 10/2005 |
| EP | 1740981 B1 | 2/2009 |
| JP | 2000039479 A | 2/2000 |
| JP | 2000065775 A | 3/2000 |

\* cited by examiner

(Prior Art)

(Prior Art)

METHOD AND DEVICE FOR ACCURATE CAPACITIVE MEASURED VALUE ACQUISITION

CROSS REFERENCE TO RELATED APPLICATIONS

The present application claims the priority of the German patent application 10 2009 050 894.5, filed on Oct. 27, 2009, as well as the priority of the German patent application 10 2009 057 493.5, filed on Dec. 9, 2009, the contents of which are hereby expressly incorporated into the subject matter of the present application.

TECHNICAL FIELD

The invention relates to a device and a method for Accurate Capacitive Measured Value Acquisition of objects located behind a flat article which is transparent to electromagnetic radiation such as a panel for example.

BACKGROUND

Sensors that detect the presence or movement of a non metallic object through a flat article, for example through a panel, which is not transparent to optical radiation are usually constructed on the basis of capacitance measuring techniques. Known applications are e.g. capacitive Touchpads such as are known from e.g. DE 103 24 579 A1, capacitive proximity sensors and so-called "stud detectors".

In the two first mentioned applications, the sensor unit is firmly connected to the panel that is to be penetrated and, as seen from the sensor unit, the object being detected moves behind this panel. Due to the mechanical arrangement thereof, the sensor and the panel have a fixed mutual capacitance which is reflected in the measured value as a constant basic capacitance.

Further applications are sensors which have to be moved over the flat article or the panel in order to locate objects lying behind it such as are known from e.g. EP 0 657 032 B1 and EP 1 740 981 B1. Falling within this category are so-called "beam finders" or "stud detectors". In general, beam finders are handy devices for do-it-yourself enthusiasts and professionals which are used for detecting beams, posts or pipes or current-carrying wires located behind solid wooden boards or paneling in e.g. prefabricated buildings. For this purpose, the sensor is guided across the wall. It measures the capacitance with respect to the wall by means of an electrode. If a timber beam, a pipe or a current-carrying wire is located within the detection range of the sensor, then this capacitance increase due to the change in the dielectric. This is evaluated accordingly and brought to the user's attention. As long as the sensor is being moved at exactly the same distance from the flat article or the panel, the capacitance between the sensor and the flat article or the panel does not change. It merely enters the test signal or the measured value signal in the form of a constant value as was the case in the first two examples. However, using the example of the stud finder, one can appreciate that, due to the manner of construction of the wall, it is almost impossible in practice to maintain a constant spacing so that the basic capacitance will change substantially in dependence on the spacing. Consequently, the stud finder has also been selected to serve as an exemplary embodiment in the following description of the invention.

In general, the basic capacitance that is formed as a result of the construction of the wall is substantially higher than the increase in capacitance due to an object located behind or within the wall. When the stud finder is being moved over the wall, even tiny amounts of tilting caused by the unevenness of the wall can cause a very large reduction in the capacitance so that an object requiring detection can no longer be recognized. This effect is particularly noticeable in the case of textured plaster, wood chip wall papers or at the joints between strips of wallpaper. Not only does textured plaster lead to tilting of the sensor, but it is usually applied unevenly as well. Since the thickness of such a layer of plaster also has a strong influence on the result of the measurement made by the sensor, the search for the beam or post becomes a matter of pure luck. Moreover, local inhomogeneities in the construction of the wall especially when they are located near the surface i.e. in the proximity of the sensor also enter into the basic capacitance.

Figure 11:
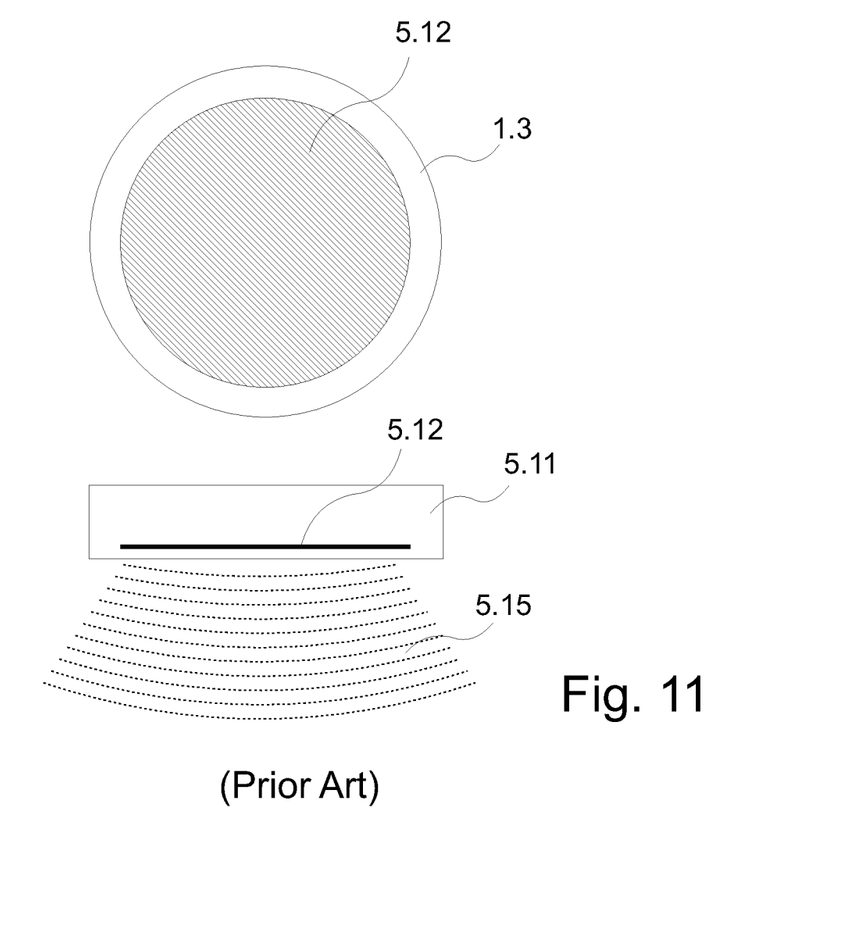

In order to provide a better explanation, the effect of the tilting process will now be illustrated on the basis of a conventional prior art sensor. FIG. 11 shows a sensor 1.3 incorporating an electrode 5.12 for the determination of the capacitance by means of an electromagnetic field 5.15. The associated electronic system is not illustrated, it being assumed that its mode of functioning is familiar.

Figure 1:
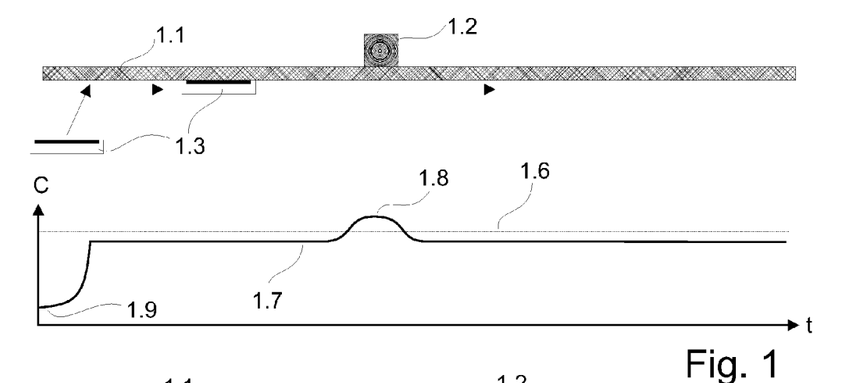
FIG. 1 shows an ideal movement of a sensor along a flat article as well as the change in the capacitance value C occurring therewith, FIG. 2 a movement of a prior art sensor along the flat article depicted in FIG. 1 as well as the change of the capacitance value C occurring therewith, FIG. 3 a movement of a sensor in accordance with the invention along the flat article depicted in FIG. 1 as well as the change of the capacitance value C occurring therewith, FIG. 4 an exemplary embodiment of a sensor electronic system comprising a closed loop regulation arrangement for keeping the signal amplitude at the sensor electrode constant, FIG. 4.1 a further exemplary embodiment of a sensor electronic system comprising impedance converters, FIG. 5 a sensor in accordance with the invention, FIGS. 6, 7 the reduction of the capacitance with increasing distance from the flat article for a sensor according to the state of the art and for a sensor in accordance with the invention, FIGS. 8, 9 an exemplary embodiment of a further sensor in accordance with the invention including measured value curves for differing capacitance ratios and a display unit in the case of a vertical beam or post and one lying diagonally, FIG. 10 an exemplary embodiment of an external circuit arrangement for the realization of the invention utilizing an IC, FIG. 11 a sensor comprising an electrode for the determination of capacitance according to the prior art.

If, in accordance with FIG. 1, the sensor 1.3 is moved from a given position towards a wall 1.1, then the capacitance value C as illustrated in the measured value curve 1.7 alters to higher values until the nearest possible point of proximity to the wall 1.1 is produced. An ideal movement along the wall will not change the measured value as long as a post or a beam 1.2 or the like is not located behind the wall. In order to indicate the presence of a beam or the like, a threshold value 1.6 as an example can be set above the measured value 1.7 in such a way that it will be exceeded due to the resultant increase in the measured value 1.8 which occurs when passing over a beam 1.2.

Figure 2:
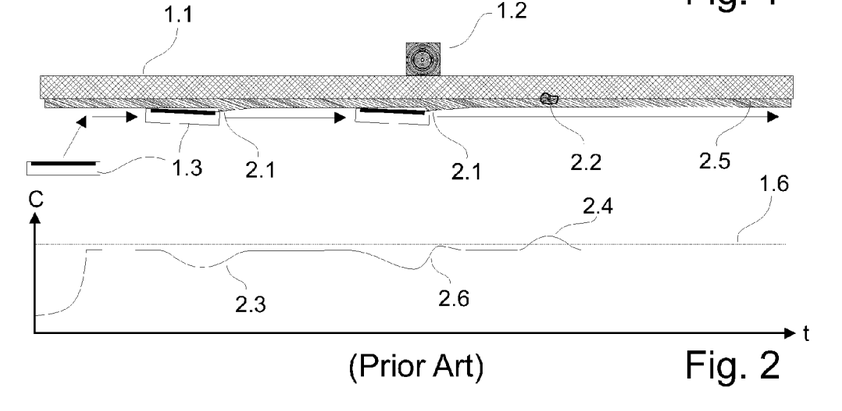

However, FIG. 2 shows a measured value curve such as often occurs in reality. The wall 1.1 illustrated here has a plaster coating 2.5, irregularities 2.1 and inhomogeneities 2.2. The irregularity can, for example, be a somewhat thicker point in the plaster or a joint in the wallpaper. When the sensor 1.3 encounters the irregularity 2.1, the surface of the sensor is forced slightly away from the wall. As a consequence, the capacitance is reduced, and the measured value curve 1.7 drops accordingly (FIG. 2, 2.3). Since the threshold value 1.6 is not exceeded in this case, this does not at first present a problem.

It does become critical however, if this irregularity lies in the vicinity of the beam 1.2 that is to be located. The result then is that the beam is not recognized (FIG. 2, 2.6). That is to say, the increase in capacitance due to the beam behind the wall is obscured due to the tilting of the sensor on the irregularity 2.1. In this case, the threshold value 1.6 is not exceeded and in consequence the beam is not located. There is a different effect in the case of an inhomogeneity, e.g. a nail. Here, the measured value 1.7 might possibly increase to such an extent that the threshold value 1.6 is exceeded and a spurious "beam" is signaled.

Figure 6:
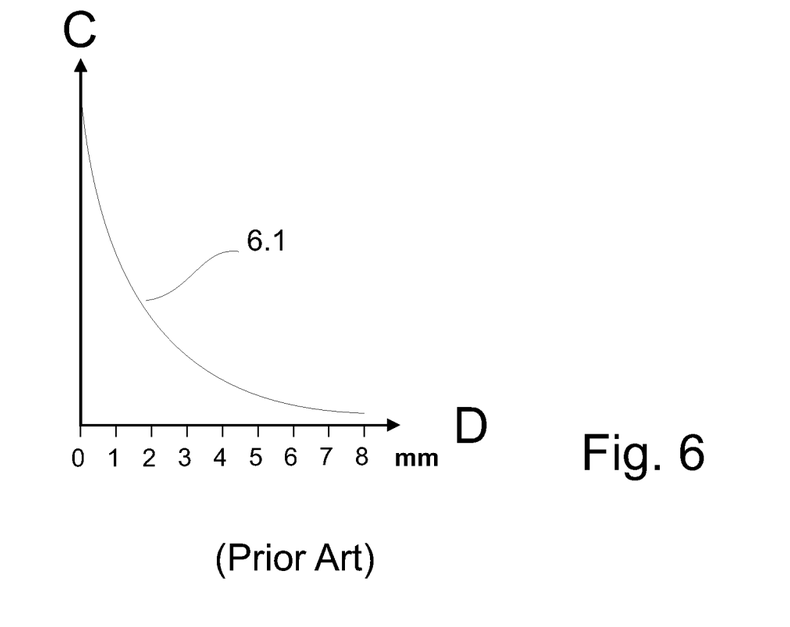

The detected decrease in capacitance of the sensor when it tilts or rises slightly away from the wall in accord with the prior art is illustrated in FIG. 6. It can be clearly perceived that in the state of the art, the largest change in the capacitance curve 6.1 occurs within the first few millimeters of a tilting action or distancing of the sensor from the surface (FIG. 6, D).

From DE 10 2005 031 607 A1, there is known a device for converting the capacitive change of signal of a differential capacitor which is used in acceleration sensors into a digital signal. A sigma delta modulator is used for this purpose. The principle of sigma delta modulation is based on a rough measurement of a signal by means of a quantizer. The measuring error arising thereby is integrated and continually compensated for by means of a negative feedback arrangement. In dependence on the type of conversion process being undertaken, the individual blocks of the sigma delta modulator are implemented in a digital or analogue manner. The differential capacitor is integrated into the negative feedback path and the reference feedback structure. A change of capacitance can thus be converted directly from an analogue value into a digital signal. Due to the integration of the differential capacitor, the output signal of the converter in the form of a binary stream is to a first approximation only dependent on the deflection of the seismic mass of the differential-capacitor. Differing reference voltages, which are selectable with particular amplitudes in a specific temporal pattern, are applied to the electrodes of the differential-capacitor. Different ranges of values and resolutions of the signal that is to be digitized can be represented by the differently selected reference voltages. A change of polarity of the input signal is realized by a suitably selected sequence of the reference voltages. In addition, an adjusting force can be exerted on the moveable electrode for the purposes of performing a self checking function by means of the sequence of reference voltages and a suitable clock-timing pattern for connecting the reference voltages to the electrodes. Averaged over time, potential equality of the electrodes is achieved by the choice of the reference voltages. Thereby, electrical charging of the seismic mass and the change of the output signal arising therefrom are prevented. There is however no oppositely directed regulation of a sensor electrode and of a further electrode surrounding the sensor electrode.

DE 198 43 749 A1 depicts a method and a circuit arrangement for evaluating small changes of capacitance in a capacitive proximity switch. To this end, use is made of a bridge circuit in which a reactance in the form of a capacitor is located in each arm of the bridge. The two bridge arm voltages are rectified separately in accord with the respective bridge arm, whereafter the diagonal bridge voltage is evaluated in the form of a DC voltage which varies in correspondence with the change in capacitance of the capacitor. The proximity switch consists of a multi-layer printed circuit board comprising two electrically insulating layers between which there is a metallic intermediate layer that serves as the first surface of a capacitor. A flat coating serving as a probe which forms the second surface of the capacitor is applied to one of the two layers. A metal surface is arranged such as to be moveable relative to the probe and forms a second variable capacitor therewith. Increased immunity to noise as well as increased temperature stability are achieved by means of this circuit arrangement. For this purpose, the circuit is adjusted by means of a variable capacitor in such a manner that the differential voltage is equal to zero at the time point when the proximity switch operates since it is sufficient then to merely evaluate the prefix sign.

In U.S. Pat. No. 7,148,704 B2, there is depicted a capacitive arrangement for establishing the position of an object namely, that of a finger on a Touchpad. The sensor used for this purpose comprises two measuring channels which are each connected to a respective electrode. The channels are operated in synchronism, whereby each channel gives a non-linear response to a capacitive effect produced by the finger. These respective output signals are combined linearly in order to supply position signals which change linearly with the position of the finger, whence the sensor works as a ratiometrical sensor.

U.S. Pat. No. 5,585,733 depicts a device and a method for measuring the change in capacitance of a capacitive sensor. To this end, means are provided for applying a constant electric current to an electrode and means are also provided for producing a first series of clock pulses. The voltage of the capacitor is compared with a reference voltage, whereby a signal is produced if the voltage of the capacitor exceeds the reference voltage. The capacitive sensor is used for measuring the change in a dimension of an article having variable dimensions such as a telescopic device for example. The capacitor is formed by two electrically conductive layers which surround dielectric sleeves of a piston. The capacitance of the capacitor is changed by the movement of the piston and thus of the sleeves. This change is detected and evaluated by the control system, whereby the change in the position of the piston is detected.

DE 39 42 159 A1 depicts a circuit arrangement for the processing of sensor signals which are detected by means of a capacitive sensor. The sensor comprises a measuring capacitance which is arranged to be affected by the physical variable requiring detection and a reference capacitor which exhibits a reference capacitance and supplies a measuring effect that is dependent on the measuring capacitance and the reference capacitance. First electrodes of the capacitors of the sensor are kept at a fixed potential, whilst, for the purposes of carrying out a charge transfer process, the second electrodes thereof are connected to a first input of an input operational amplifier the second input of which is at a reference potential. The reversal of charge on the capacitors of the sensor that is necessary for producing the trans-ported charge is effected by switching over the reference potential of the input operational amplifier. Consequently, the two inputs of the operational amplifier are virtually at substantially the same potential. Thus, due to the change-over of the reference potential of the input operational amplifier, the potential of the capacitor electrode connected to the other input is also changed in the same way on each occasion. Consequently, the necessary changes in voltage on the capacitor electrodes connected to the signal line are made so that only they are active. The other electrodes are then inactive and are at any arbitrary potential, for example, at the potential of the housing for the sensor.

BRIEF SUMMARY

The invention provides a capacitive sensor which reduces and in the best case does not react to tilting relative to the surface or to small changes in the spacing from the surface.

There thus ensues a sensor which can also take account of a variable spacing relative to the flat article, a panel for example. At the same time, the surrounding electrode suppresses electrical influences e.g. those due to films of moisture on the sensor surface. Thus, in the case of the exemplary embodiment of a "stud finder", this results in a sensor which does not react to tilting due to unevenness in the wall, slight movements away therefrom, differing thicknesses of a plaster layer or local inhomogeneities. At the same time, there is a process of oppositely directed regulation respectively closed-loop control of a sensor electrode and of a surrounding further electrode surrounding the sensor electrode.

In addition, the signals can preferably be amplified to such an extent as to produce a significantly greater range e.g. behind the flat article over which the sensor is being swept or such as to enable the objects to be highlighted more clearly. If, hereby, a calculation is effected using the measured values from several sensor electrodes for representing the position and/or the thickness of the object, then this can be illustrated on a display. In exactly the same manner, this also relates to the illustration of an inhomogeneity in the form of a single object e.g. a screw on the display.

In the case of an application to Touchpads and proximity sensors, a capacitive sensor of small dimensions can be realized, such a sensor serving to detect the position of a finger in the case where the finger is only tilted from a fixed point of rest or is just slightly "rolled" from the position. The detected position can then be used e.g. for controlling a cursor. In order to achieve a perceptible haptic effect, the surface is pressed, e.g. in order to actuate a mechanical micro switch, and thereby initiate a function. If, for constructional reasons, the capacitive sensor is not integrated into the moveable part, the detected position will not be "pulled-away" despite the movement of the surface during the pressing process.

In the case of the Touchpad a mouse function can be illustrated directly on the display instead of the "beam" as the result of the calculation of the measured value curves of a plurality of sub-portions of the sensor. In addition, due to the high sensitivity of the system, it is also possible to detect the spacing of an approaching object such as a finger in the direction of the Z-axis.

Preferably, in the case of a "stud finder", not only the presence but also the location of a beam behind the wall are illustrated.

Further advantages are apparent from the appendant Claims and the following description.

BRIEF DESCRIPTION OF THE FIGURES

The invention will be described hereinafter on the basis of the exemplary embodiments illustrated in the accompanying Figures. Therein.

DETAILED DESCRIPTION

The invention will now be described in more detail in exemplary manner with reference to the accompanying drawings. However, the exemplary embodiments are merely examples which are not intended to restrict the inventive concept to a certain arrangement. Before the invention is described in detail, it should be pointed out that it is not limited to the particular components of the device nor the particular method steps, since these components and methods can vary. The terms used here are only intended to describe specific embodiments and are not used in a restrictive sense. In addition, if the singular or indefinite articles are used in the description or in the claims, this also refers to a plurality of these elements insofar as the general context does not unambiguously indicate that something else is meant.

Figure 5:
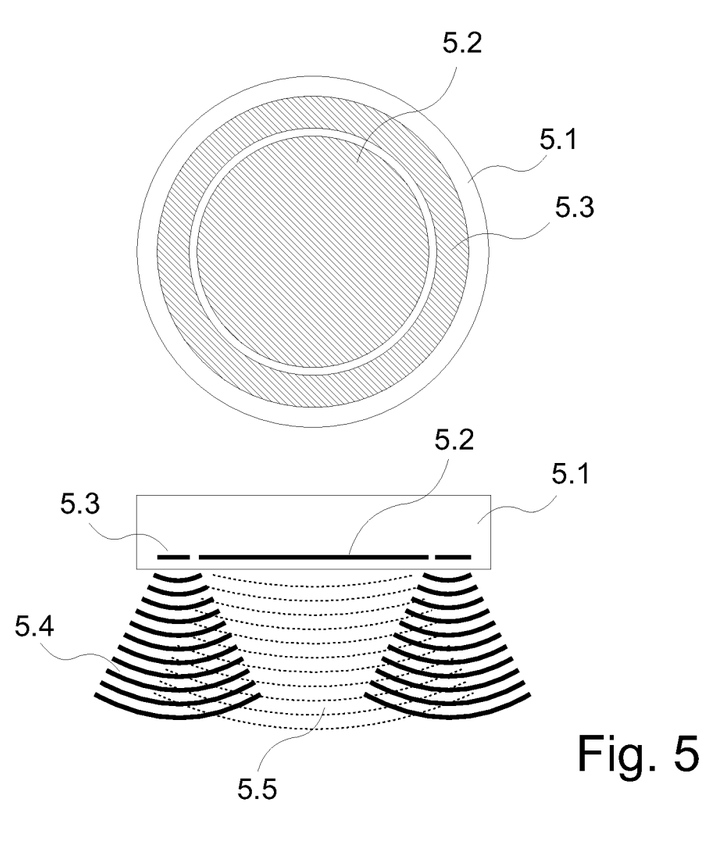

In contrast to the state of the art, at least two electrodes are used for detection purposes in the sensor 5.1 in accordance with the invention. FIG. 5 shows one possible arrangement. Therein, an annular electrode 5.3 surrounds the sensor electrode 5.2.

Here however, we are not concerned with shielding electrodes that are often used in the state of the art for screening the inhomogeneous boundary region of the electrical field of a capacitive sensor from the measured value electrode so as to ensure a homogeneous field right up to the edge of the sensor surface. These are of course kept at the same potential in dependence on the potential on the measured value electrode. The parasitic capacitance with respect to a surrounding earthing surface is eliminated thereby. One prefers this approach, when only small changes of capacitance on the measured value electrode are to be detected. If this type of measuring arrangement were to be used for locating a beam, then a curve approximately similar to that illustrated in FIG. 6 would occur when the sensor is tilted.

If, in the state of the art, the potential on the measured value electrode rises or falls, then the shielding electrode follows this potential. The "potential" applied to the measured value electrode in high impedance manner may be in the form of a sinusoidal or a rectangular pulse alternating voltage, an increase in capacitance on the measured value electrode leading to a deformation or, at a corresponding frequency, to a reduction of the alternating voltage.

In the further description, a "high impedance" coupling means that a change of capacitance, e.g. due to a beam behind the wall, leads to an evaluable change in the signal on the measured value electrode. Accordingly, a "low impedance" coupling means that the e.g. regular, large change in capacitance due to the sensor approaching the wall does not lead to a substantial effect upon the waveform of the alternating voltage.

A "high impedance" coupling of the measured value electrode to the sending electronic system can be effected by means of an e.g. 470 KOhm resistance (at a frequency of e.g. 100 kHz). Here, small changes of capacitance at the measured value electrode can also be clearly perceived in the waveform. A "low impedance" coupling is present in the case of resistance values of e.g. 100 ohms, a small change of capacitance at the connected electrode then leads to a scarcely measurable effect on the signal.

In the method in accordance with the invention however, the surrounding further electrode 5.3 that is depicted in FIG. 5 does not follow the potential on the sensor electrode 5.2 or the measured value electrode. Rathermore, the sensor electrode is permanently kept at a predetermined constant potential. In the case of a fall in potential due to an increase in capacitance at the sensor electrode 5.2, the potential on the surrounding electrode 5.3 is readjusted until such time as the predetermined constant potential reappears on the sensor electrode 5.2. The value of the adjustment is then the value of the change of capacitance at the sensor electrode.

In the following exemplary embodiment, a rectangular alternating voltage having a frequency of 100 kHz is applied. In the case of a corresponding high impedance coupling, the amplitude on the sensor electrode 5.2 changes when there is a change of capacitance. The change in amplitude when approaching a wall then amounts to e.g. 10%, an additional beam 1.2 behind the wall changes the amplitude additionally by e.g. 0.1%. In practice, these values correspond to a wooden wall of 18 mm thickness and a 5×5 cm beam, but can however differ markedly for different types of wall construction and the diverse types of object located behind it.

If reference is made hereinafter to signal amplitudes on the electrodes, then this expression refers to the above mentioned illustration.

Figure 4:
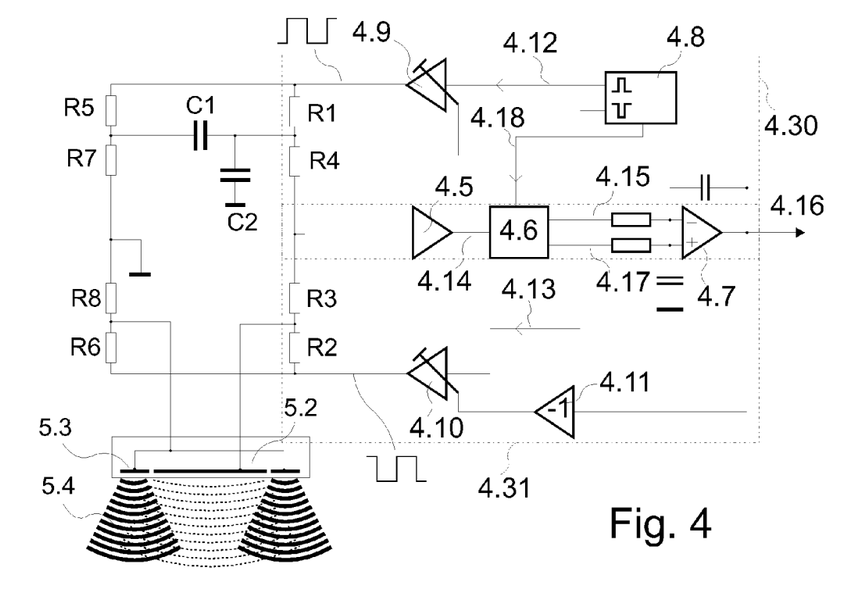

FIG. 4 shows an exemplary embodiment of a sensor electronic system incorporating a closed-loop regulating arrangement for maintaining constant the signal amplitude on the sensor electrode. A clock pulse generator 4.8 supplies a first clock pulse signal 4.13 having a frequency of e.g. 100 kHz to a first regulated voltage source 4.10 and a second inverted clock pulse signal 4.12 to a second regulated voltage source 4.9. The first regulated voltage source 4.10 feeds the low impedance voltage divider composed of R6 and R8 to the center point of which the electrode 5.3 is connected.

In parallel therewith, the same voltage source 4.10 feeds the high impedance voltage divider R2 and R3. The foot of R3 is connected to the input of the alternating voltage amplifier 4.5. Since the input signal of this amplifier is always kept constant at "0" due to the regulation process that is described in more detail hereinafter, one can assume here that the voltage divider R2/R3 represents a virtual earth potential. The sensor electrode 5.2 is connected to the center point of the voltage divider R2 and R3.

The ratio of R2 to R3 preferably corresponds to the ratio of R6 to R8. In practice for example, 100 ohms each for R6 and R8 and 470 KOhm each for R2 and R3.

In analogy to this arrangement, the second regulated voltage source 4.9 feeds the low impedance voltage divider R5 and R7 and the high impedance voltage divider R1 and R4. The sensor electrode 5.2 forms a capacitance with respect to its environment, e.g. with respect to the housing of the sensor. The capacitance of the capacitor C2 is selected to be approximately as large as this capacitance. There is also a capacitance between the sensor electrode 5.2 and the surrounding electrode 5.3. The capacitance of the capacitor C1 is selected to be approximately as large as this capacitance. C2 thus forms the fixed reference capacitance for the sensor electrode 5.2. The values of R5, R7, R1 and R4 correspond to the values for R6, R8, R2 and R3. This part of the circuit as a whole thus forms a reference path for the sending path comprising the sensor 5.1, 8.1.

The calculation for the measured values from a plurality of sensor electrodes or sub-portions SA, SB, SC, SD of the sensor can thus be used for representing the position and/or the thickness of the object behind a wall on a display or else for the representation of an inhomogeneity such as a single object in the form of a screw on the display. In the other fields of application of the invention, a mouse function on the display is also conceivable. Instead of the "beam", a mouse function is then illustrated on the display, whereby the calculation based on the measured value curves can be effected in the same way.

In the case where the same voltage is present at the outputs of the voltage sources 4.10 and 4.9, the input signal to the alternating voltage amplifier 4.5 is cancelled off. Since the amplifier 4.5 only sees noise at its input in the compensated state of the circuit, it can have a very high amplification factor, or be implemented as a high amplification limiter amplifier. The output signal of the amplifier 4.5 is supplied to the synchronous demodulator 4.6. The latter receives the clock pulse signal that is needed for the demodulation process from the clock generator 4.8 via 4.18. In the simplest case, the synchronous demodulator 4.6 supplies the output signal of the amplifier 4.5 synchronously to the appropriate inputs of the integrating comparator 4.7 during the entire period of a clock phase. It is also possible however, to perform the demodulation function only in parts of a clock phase. Thus, in the case where the voltages of the first input signal 4.15 and the second input signal 4.17 of the integrating comparator 4.7 are the same, there will be no clock synchronous signal component at the input of the alternating voltage amplifier 4.5.

The output signals of the synchronous demodulator 4.6 that are associable with the two clock pulse signals 4.12 and 4.13 are examined for amplitude differences by the integrating comparator 4.7. The comparator 4.7 can be implemented in the form of a high amplification comparator circuit. Every even smallest deviation of the input voltages 4.15 and 4.17 leads to a corresponding deviation of the control value 4.16 from its momentary value. Due to the highly sensitive nature of the system, i.e. due to the high amplification factor, it is also possible for the sensor to have a proximity function in the direction of a Z-axis. The associated information can be deduced from the amplitude of the measured value curves. Thus, for example, in the case of a mouse function, detection of a finger is possible up to e.g. 50 mm.

The regulated voltage sources 4.9 and 4.10 are controlled in mutually opposite senses with the aid of the control value 4.16 by means of the inverting stage 4.11. If the voltage of one of the regulated voltage sources rises, then it drops in correspondence therewith in the other. For the function of the sensor in accordance with the invention however, both voltage sources 4.9 and 4.10 do not necessarily have to be regulated in mutually opposite senses, it also suffices if the regulation process is applied to just one voltage source. The control loop is closed by the voltage dividers formed of R1, R4 and R2, R3. Accordingly, the path via R1 and R4 forms the reference for the path via R3 and R2.

Consequently, without the influence of a flat article which changes the capacitance of the sensor e.g. the wall, the voltages at the output of the regulated voltage sources 4.9 and 4.10 are equalized with the result that clock synchronous components will not develop at the input of the amplifier 4.5, i.e. there will only be a noise signal on the input of the amplifier 4.5. The regulating output 4.16 will thus adopt a certain electrical value which corresponds to the particular capacitance value of the sensor electrode 5.2 determined by its construction.

If, for example, the sensor is now placed on the wall, the capacitance of the two electrodes 5.2 and 5.3 changes. Preferably, the surface area of the surrounding electrode 5.3 that is actively effective on the surface of an object is of about the same size as the surface area of the sensor electrode 5.2. The change of capacitance on the surrounding electrode 5.3 has as good as no effect at all on the control loop. Things are somewhat different for the sensor electrode 5.2. The voltage will tend to decrease due to the inherent high impedance of R2, R3. In this case, a clock synchronous signal component develops at the input of the amplifier 4.5, but this is immediately regulated back to "0". The control value 4.16 changes in an appropriate manner for this purpose. Corresponding amplitude regulators 4.30, 4.31, shown in FIG. 4, include the components within the respective frames.

Consequently, the voltage on the sensor electrode 5.2 is always maintained equal to the voltage on C2. An increase of the capacitance on the sensor electrode thus produces no change of the voltage level on the sensor electrode, but rather, it leads to an increase of the voltage and thus of the electrical field 5.4 of the surrounding electrode 5.3.

Figure 7:
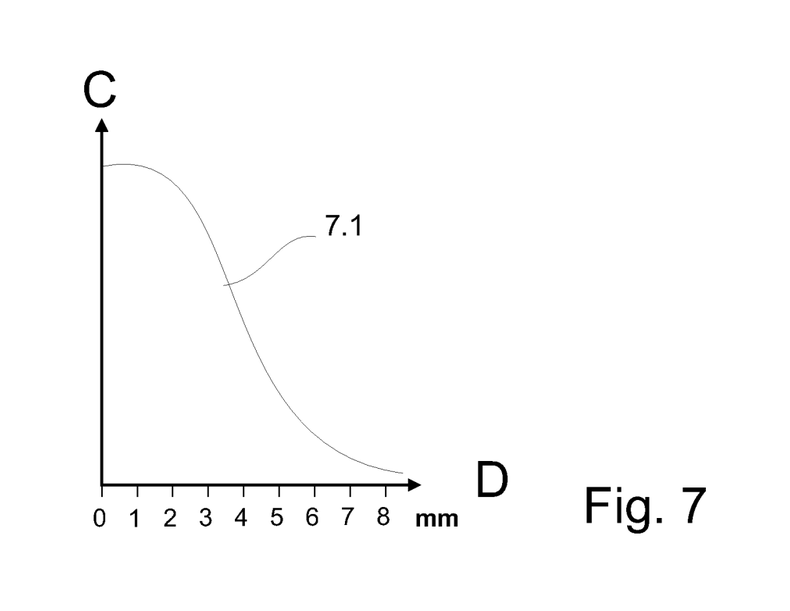

The advantage resulting therefrom is illustrated in FIG. 7. In comparison, FIG. 6 shows the capacitance curve 6.1 of a sensor according to the state of the art. When tilting or moving slightly away from the wall, a large change of capacitance immediately occurs. If such a sensor is guided across a wall incorporating irregularities, the error initially described in FIG. 2 occurs. By contrast, FIG. 7 shows the change of capacitance such as occurs when the sensor tilts or moves slightly away from the wall to a similar extent in the case of the method in accordance with the invention. Changes in the spacing in a range close to the wall lead to virtually no change of capacitance and thus too, to no change in the control value. However, changes of capacitance in ranges that are somewhat further removed from the sensor are detected perfectly.

Figure 3:
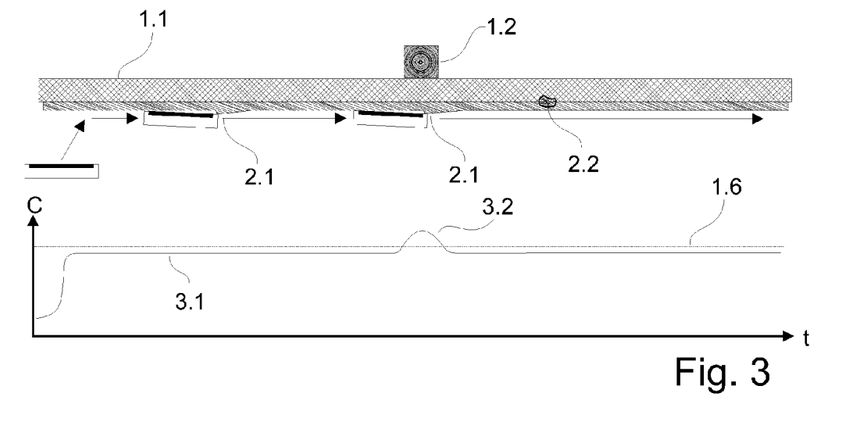

If, as shown in FIG. 3, such a sensor is guided across the wall 1.1, then irregularities 2.1 as well as inhomogeneities 2.2 have no influence on the capacitance value C and thus on the control value 4.16. The process of locating the beam 1.2 disposed behind the wall takes place perfectly (FIG. 3, 3.2).

Measurements obtained in practice have demonstrated that in the case of a sensor in accordance with the invention having a surface area of 40 mm in diameter placed on an 18 mm thick chip board, tilting of 4-5 mm or lifting by 2 mm has substantially no effect upon the result of the measurement. Thereby, it was irrelevant as to whether a beam was or was not located behind the chip board.

In the exemplary embodiment of FIG. 4, the high impedance resistances R3 and R4 serve for tapping off the voltage signal at the sensor electrode 5.2 in high impedance manner. If the values thereof are selected such as to be equal to the respective values of R1 and R2, then the signal that is to be detected reduces accordingly.

Figure 41:
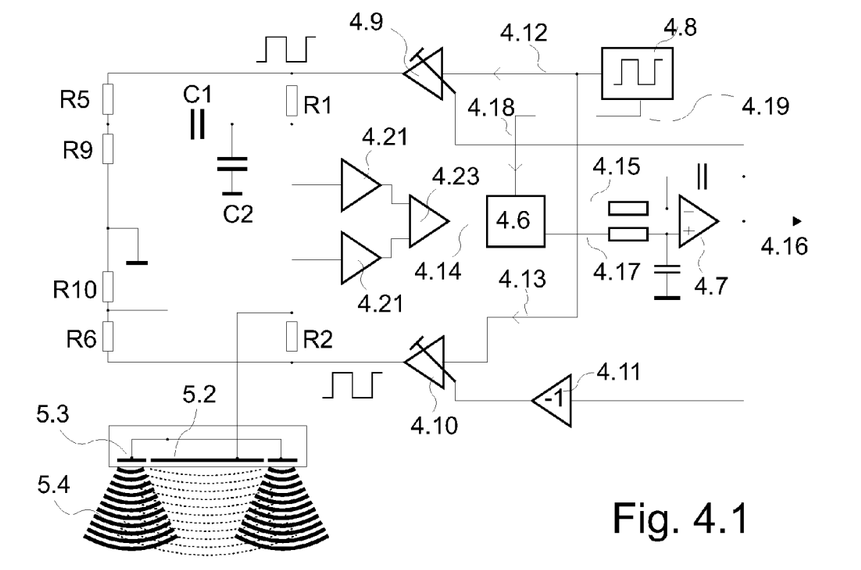

For the purposes of increasing the sensitivity of the sensor, the signal on the sensor electrode 5.2 or the capacitor C2 can, as depicted in FIG. 4.1, be picked up directly by corresponding impedance converters 4.21 and subjected to further processing by a following differential amplifier 4.23. In this case, the signals of the voltage sources 4.9 and 4.10 are in synchronism. The resistances R9 and R10 are then preferably selected to be equal to the input resistance of the input impedance of the impedance converters 4.21 or can be dispensed with in the case of appropriately high impedance input impedances of 4.21. Here, the transmit clock pulse rates 4.12 and 4.13 are not phase shifted.

Figure 8:
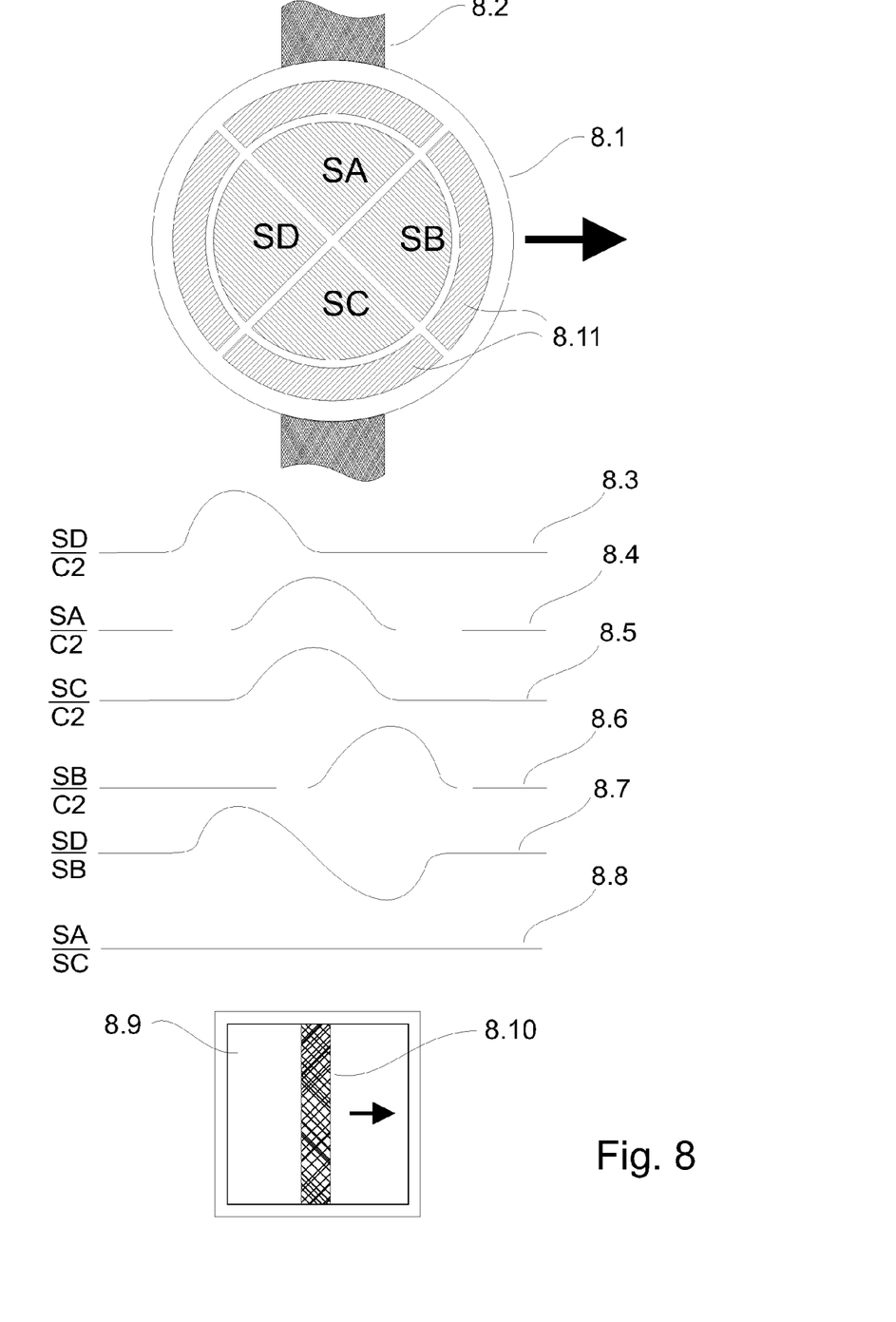

FIG. 8 shows a further embodiment of a sensor 8.1 in accordance with the invention. The sensor surface 5.2 was sub-divided into four sub-portions of the sensor, i.e. SA, SB, SC and SD. In correspondence with FIG. 5, each sub-portion of the sensor is embraced by the corresponding surrounding electrode sub-portion 8.11. In addition or as an alternative thereto, the sub-portions of the sensor can, for their parts, also be surrounded by a respective corresponding electrode either completely or in sections thereof. A measurement can now be effected in a manner such that each electrode sub-portion is measured against the reference capacitance C2. For example, SD against C2 etc. Additionally, each of the sub-portions of the sensor can also be measured in relation to another sub-portion, e.g. for the purposes of deciding as to whether the object behind the sensor is an oblong beam or just a small single object. In the exemplary embodiment in FIG. 8, there are illustrated the measured waveforms for the sub-portion SD of the sensor against SB and SA against SC. In FIG. 8, a beam 8.2 is passed by from left to right under the sensor 8.1. The measurements from the sub-portions SA to SD of the sensor with respect to the reference capacitance C2 result in the measured value curves 8.3, 8.4, 8.5 and 8.6. The location of the beam can be calculated and represented as a beam 8.10 on a display 8.9 from these measured value curves alone.

Figure 9:
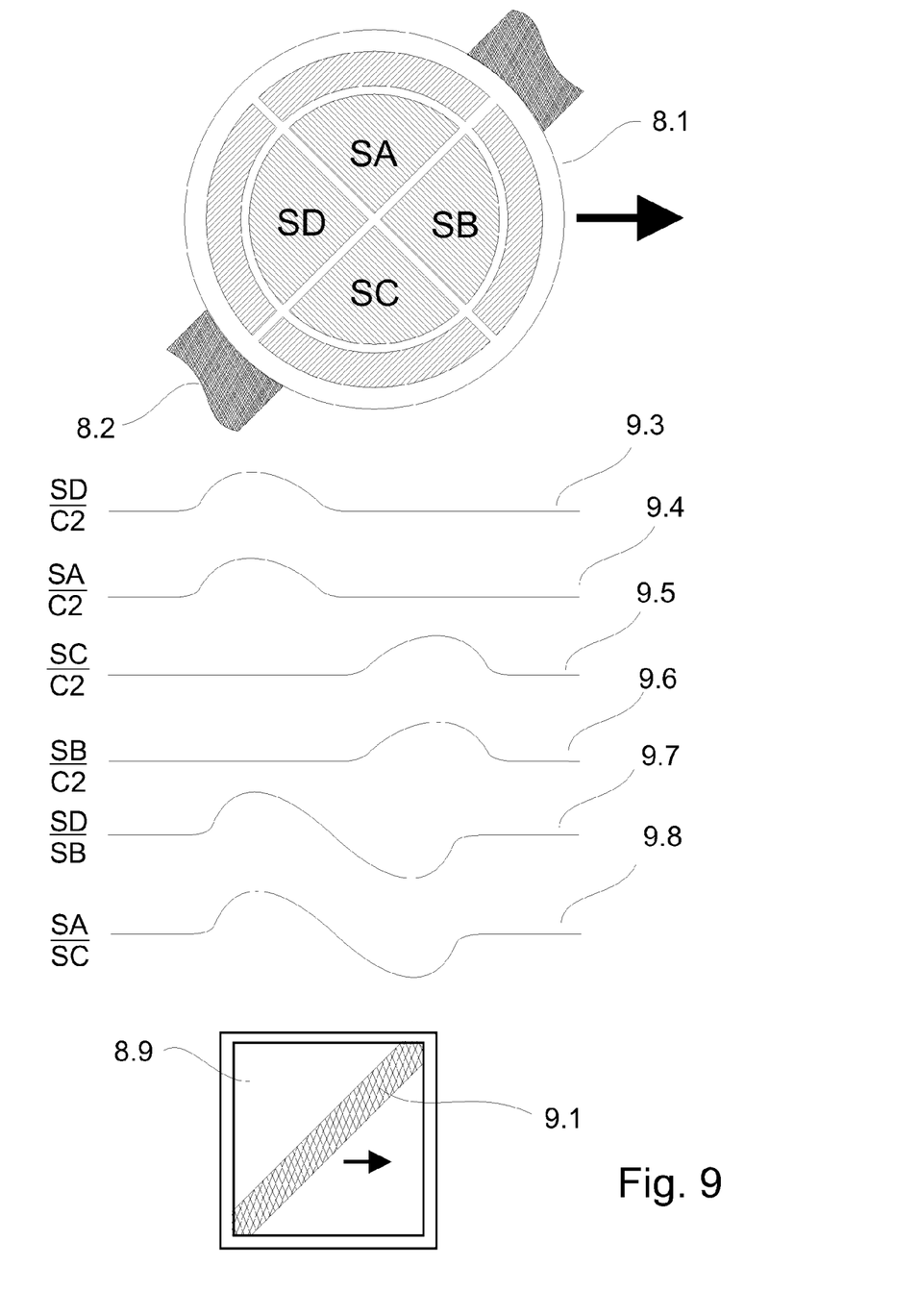

The ratio of the capacitances of the sub-portions of the sensor relative to one another provide additional information. In the exemplary embodiment, the capacitance ratio of the sub-portion SD of the sensor to the sub-portion SB of the sensor is illustrated in the measured value curve 8.7 and the capacitance ratio of the sub-portion SA of the sensor to the sub-portion SC of the sensor is illustrated in the measured value curve 8.8. The measured value curve 8.8 contains e.g. no information since the movement of the beam affects the sub-portions SA and SC of the sensor to the same extent. The exact location of the beam can thus be calculated and presented accordingly in the display. In addition, the width of the beam can be deduced from the magnitude of the changes of the measured value in the measured value curve and this is presented accordingly in the display. FIG. 9 shows the measured value curves 9.3 to 9.8 and the corresponding diagonal representation of the beam 9.1 on the display 8.9 in the case of a diagonal movement behind the sensor 8.1.

Figure 10:
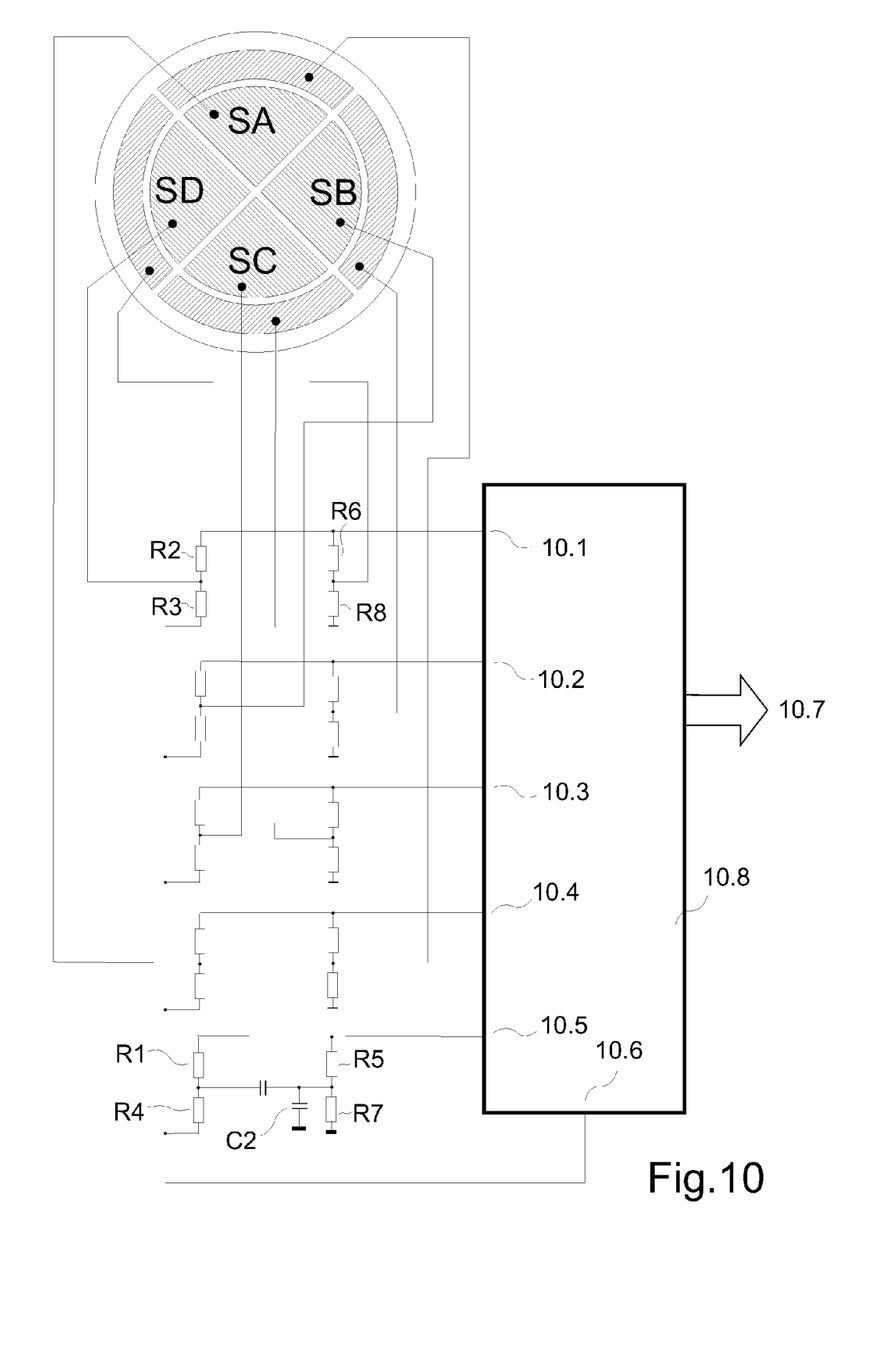

The IC 909.05 from the Elmos Semiconductor AG provides one possibility for implementing the electronic system 10.8 for the invention described above. FIG. 10 shows the basic external circuit arrangement for the realization of the invention. The IC contains five freely configurable regulated power sources 10.1 to 10.5 (corresponding to the regulated voltage sources 4.9, 4.10), an input 10.6, the digital implementation of the signal processing described in the invention, an internal data processing arrangement and an appropriate data transfer system 10.7.

In FIG. 10 utilizing the example of the circuit layout of the regulated power source 10.1, there is an illustration of how the respective resistances for the one sensor electrode and the surrounding electrode that are employed in the invention described above can be wired up, and likewise, the wiring diagram for a reference capacitance C2 is shown.

It is self-evident that this description can be subjected to the most diverse modifications, changes and adaptations which fall within the range of equivalents to the attached Claims.

The invention claimed is:

1. A device for the capacitive detection of an object such as a post, a line or a finger which is arranged behind a flat article that is transparent to electromagnetic radiation, comprising
   a sensor which comprises at least one sensor electrode for at least one of the detection of the object or for the detection of relative movements between the sensor and at least one of the flat article or the finger,
   a control circuit for controlling the at least one sensor electrode and for evaluating the output signals of the sensor,
   wherein the at least one sensor electrode surrounded by at least one surrounding further electrode, wherein the surrounding further electrode is connected to the at least one sensor electrode by the control circuit whereby in the event of a change in a potential of the at least one sensor electrode, a potential of the surrounding further electrode is regulated by a closed-loop control in the opposite sense to the at least one sensor electrode whereby the at least one sensor electrode remains at a pre-determined or a pre-definable potential.

2. A device according to claim 1, wherein the flat article is a wall.

3. A device according to claim 1, wherein at least one sensor electrode comprises a plurality of sensor sub-portions which are surrounded by the at least one surrounding further electrode, and wherein there is provided an evaluating unit which evaluates the capacitance ratios of at least one of between the sub-portions of the sensor or of at least one of the sub-portions and the surrounding further electrode, relative to each other or to a reference capacitance for determining at least one of the location or the thickness of the object or of inhomogeneities.

4. A device according to claim 3, wherein the sensor sub-portions are surrounded individually by the at least one surrounding further electrode.

5. A device according to claim 1, wherein the surface area of the surrounding further electrode which is actively effective on the surface of the object is of the same size as the surface area of the at least one sensor electrode.

6. A device according to claim 1, wherein the control circuit comprises a clock pulse generator which delivers a clock pulse signal to the surrounding further electrode for regulating the potential of the at least one sensor electrode and supplies an electrical signal in the form of an inverted clock pulse signal to a reference capacitance, wherein a signal received from the at least one sensor electrode is affected by external influences and forms an input signal having the inverted clock pulse superimposed thereon.

7. A device according to claim 1, wherein a synchronous demodulator for the allocation of an input signal in a clocked manner is provided wherein a cyclically sub-divided input signal is present at inputs of a comparator for forming a comparative value serving as a control value, and in that at least one amplitude regulator is provided in the signal path of at least one of the clock pulse signal and the inverted clock pulse signal, said amplitude regulator utilizing the control value for regulating the amplitude values of the clock pulse signals wherein the amplitudes of the cyclically sub-divided input signal are of the same magnitude as one another so that the input signal at the inputs of the comparator does not contain clock synchronous components in the stabilized state.

8. A method for the capacitive detection of an object such as a post, a line or a finger which is arranged behind a flat article that is transparent to electromagnetic radiation, wherein there is a relative movement between a sensor provided with at least one sensor electrode and at least one of the flat article and the object, and a location of the object is determined by detecting a plurality of changes of capacitance, wherein a control circuit controls the at least one sensor electrode of the sensor and evaluates an output signal thereof, wherein, in the event of a change of a potential of the at least one sensor electrode, a potential of at least one surrounding further electrode surrounding the at least one sensor electrode is regulated by a closed-loop control in the opposite sense to the at least one sensor electrode so that the at least one sensor electrode remains at a pre-determined or a pre-definable potential.

9. A method according to claim 8, wherein the capacitance ratios of at least one of between a plurality of sub-portions of the sensor or of at least one of the sub-portions and the surrounding further electrode, relative to each other or to a reference capacitance are evaluated for determining at least one of the location or the thickness of the object or of inhomogeneities.

10. A device according to claim 9, wherein the sensor sub-portions are surrounded individually by the at least one surrounding further electrode.

11. A method according to claim 8, wherein the signal from the sensor is tapped off in high impedance manner by an active circuit and in particular by means of impedance converters and wherein, following the active circuit, a process of combining the signal from the at least one sensor electrode with a reference signal from a reference path is effected actively by a differential amplifier.

12. A method according to claim 8, wherein a clock pulse generator supplies a clock pulse signal to the surrounding further electrode for regulating the potential of the at least one sensor electrode and also supplies an inverted clock pulse signal to at least one reference capacitance and superimposes thereon the signal received from the at least one sensor electrode.

13. A method according to claim 12, wherein the clock pulse generator supplies the clock pulse signal to the surrounding further electrode, said clock pulse signal being received in like phase by the at least one sensor electrode, wherein the signal on the at least one sensor electrode can be affected by outside influences and, together with the superimposed inverted clock pulse signal, forms an input signal, and wherein the input signal is sub-divided in a clocked manner wherein a resultant clockwise cyclically sub-divided signal appears at inputs of a comparator for forming a comparative value serving as a control value.

14. A method according to claim 13, wherein at least one amplitude regulator is provided in a signal path of at least one of the clock pulse and the inverted clock pulse, said amplitude regulator utilizing the control value for regulating the amplitude values of the clock pulse signals wherein the amplitudes of the clockwise cyclically sub-divided input signal are of substantially the same size as each other so that the input signal at the inputs of the comparator does not contain clock synchronous components.

15. A method according to claim 8, wherein the control circuit derives the spacing of an object relative to the sensor from the amplitude of the measured value curves using high amplification factor components.

* * * * *